United States Patent [19]

Murayama

[11] Patent Number: 5,349,227
[45] Date of Patent: Sep. 20, 1994

[54] SEMICONDUCTOR INPUT PROTECTIVE DEVICE AGAINST EXTERNAL SURGE VOLTAGE

[75] Inventor: Motoaki Murayama, Tokyo, Japan

[73] Assignee: NEC Corporation, Tokyo, Japan

[21] Appl. No.: 961,863

[22] Filed: Oct. 15, 1992

[30] Foreign Application Priority Data

Oct. 25, 1991 [JP] Japan .................. 3-279522

[51] Int. Cl.$^5$ ............. H01L 29/06; H01L 29/78; H01L 27/02
[52] U.S. Cl. .................. 257/361; 257/360; 257/362; 257/378; 257/393; 361/101
[58] Field of Search ............. 257/355, 356, 357, 360, 257/361, 362, 378, 393; 361/100, 101

[56] References Cited

U.S. PATENT DOCUMENTS

| | | | |
|---|---|---|---|
| 4,692,781 | 8/1987 | Rountree et al. | 357/23.13 |
| 4,903,093 | 2/1990 | Ide et al. | 357/23.13 |

FOREIGN PATENT DOCUMENTS

| | | | |
|---|---|---|---|
| 55-98867 | 7/1980 | Japan | 257/360 |
| 0055552 | 7/1982 | Japan | 257/362 |
| 59-231847 | 12/1984 | Japan | 257/360 |
| 61-15373 | 1/1986 | Japan | 257/360 |
| 3-196677 | 8/1991 | Japan | 257/360 |

*Primary Examiner*—Ngan Van Ngo
*Attorney, Agent, or Firm*—Sughrue, Mion, Zinn, Macpeak & Seas

[57] ABSTRACT

A semiconductor input protective device has an NPN type bipolar transistor and an N-channel MOS transistor. In the NPN type bipolar transistor, the collector is connected to a signal line and the emitter and the base are commonly connected to a ground line. In the N-channel MOS transistor, either the drain or the source is connected to the signal line and the other of either the drain or the source is connected to the signal line and the gate is connected to either the signal line or the power source line. The N-channel MOS transistor has a threshold voltage higher than the power source voltage. The NPN type bipolar transistor and the N-channel MOS transistor having a thick gate insulation film are used as input protection elements so that, even when a high voltage interface is effected, the function of the protective MOS transistor is not interfered with.

3 Claims, 2 Drawing Sheets

SEMICONDUCTOR INPUT PROTECTIVE DEVICE AGAINST EXTERNAL SURGE VOLTAGE

BACKGROUND OF THE INVENTION (1) Field of the Invention

The present invention relates to a semiconductor input protective device, and more particularly to a semiconductor input protective device for protecting internal circuits against an abnormal voltage (hereinafter referred to as a "surge voltage") externally applied to a signal line.

(2) Description of the Related Art

A conventional semiconductor input protective device has CMOS semiconductor device, of the kind to which the present invention relates, is shown in FIG. 1A. As shown therein, the semiconductor input protective device is constituted by an N-channel MOS transistor M1 having a drain (an N-type diffusion layer 103-1) connected to a signal line 8 which is in turn connected to a pad 9, a source (an N-type diffusion layer 103-2) and a gate electrode 5N both connected to a ground line 6, and a P-channel MOS transistor M2 having a drain (a P-type diffusion layer 102-2) connected to the signal line 8, a source (a P-type diffusion layer 102-1) and a gate electrode 5P both connected to a power source line 7. FIG. 1B is an equivalent circuit diagram of the above semiconductor input protective device.

The above conventional input protective device operates as follows. When a surge voltage positive with respect to the ground line 6 is applied to the signal line 8, the surge voltage is released or discharged to the ground line 6 by the lateral NPN bipolar action of the N-channel MOS transistor M1 and, when a negative surge voltage is applied to the signal line 8, a parasitic PN-diode D1 existing between the drain 103-1 of the MOS transistor M1 and a P-type silicon substrate 1 is forwardly biased, so that the surge voltage can be released to the ground line 6.

Similarly, when a surge voltage positive with respect to the power source line 7 is applied to the signal line 8, a parasitic PN-diode D2 existing between the drain 102-2 of the P-channel MOS transistor M2 and an N-well 10 is forwardly biased, so that the surge voltage can be released to the power source line 7. On the other hand, when a negative surge voltage is applied to the signal line 8, the surge voltage can be released to the power source line 7 due to a drain breakdown of the P-channel MOS transistor M2.

The MOS semiconductor device used in the above conventional semiconductor input protective device normally has a gate oxide film the thickness of which is the same as that in the MOS semiconductor device of an internal circuit. Therefore, assuming that, for example, the thickness of the gate oxide film is 10 nm, the operating voltage is 3.3 V and the input signal has a TTL (Transistor-Transistor-Logic) level of 5 V, the gate oxide film 11 of the protective MOS semiconductor device will be subjected constantly to an electric field at a maximum of 5.5 MV/cm, thereby allowing the flow of the tunnel current (Fowler-Nordheim current) through the semiconductor device concerned. This state constantly continues during the operation of the semiconductor device, so that the gate oxide film gradually deteriorates, thereby leading eventually to insulation breakdown and to the inability of the MOS semiconductor device to function as a protective device. This is one of the problems in the conventional semiconductor input protective device which is to be solved by the present invention.

SUMMARY OF THE INVENTION

It is, therefore, an object of the invention to overcome the problems in the conventional semiconductor input protective device and to provide an improved semiconductor input protective device in which the resistance against surge voltages externally applied to a signal line is effectively enhanced.

According to one aspect of the invention, there is provided a semiconductor input protective device formed between a power source line and a ground line, the device comprising:

an NPN type bipolar transistor having a collector connected to a signal line extending to a pad, and an emitter and a base commonly connected to the ground line; and an N-channel MIS (Metal Insulator Semiconductor) transistor in which either a drain or a source thereof is connected to the signal line and the other of either the drain or the source is connected to the power source line, a gate is connected to either the signal line or the power source line, the N-channel MIS transistor having a threshold voltage higher than a power source voltage supplied to the power source line and having a gate insulation film thicker than a gate insulation film of a MIS transistor constituting an internal circuit.

According to the present invention, since the lateral NPN type bipolar transistor and the N-channel MIS transistor having a thick gate insulation film are used as input protective elements, it is possible to prevent the protective MIS transistor from failing to operate correctly thereby improving the reliability of the semiconductor device.

BRIEF DESCRIPTION OF THE DRAWINGS

The above and other objects, features and advantages of the present invention will be apparent from the following description of a preferred embodiment of the invention explained with reference to the accompanying drawings, in which.

DESCRIPTION OF THE PREFERRED EMBODIMENT

Now, a preferred embodiment of the invention is explained with reference to the appended drawings in which the same or similar reference symbols or numerals refer to the same or like elements.

Figure 2A:
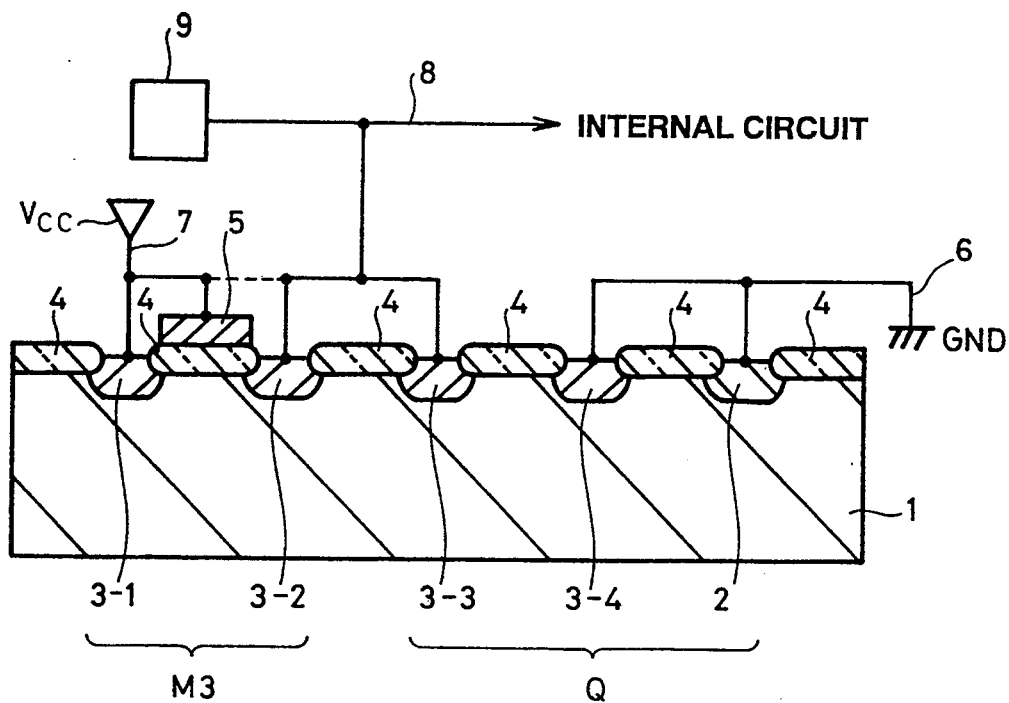
FIG. 2A is a schematic sectional view showing a semiconductor input protective device of an embodiment according to the invention.
Figure 2B:
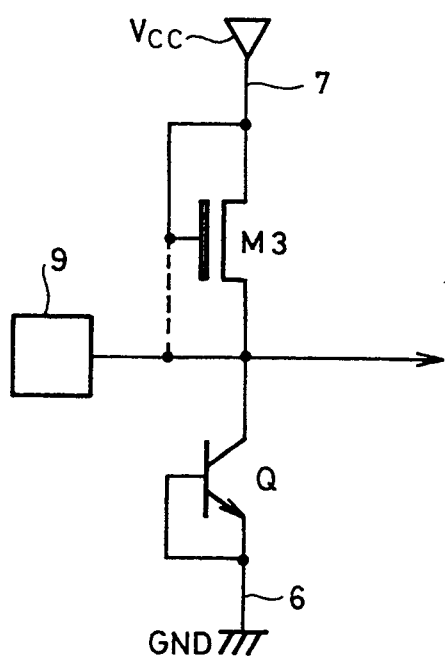
FIG. 2B is an equivalent circuit diagram of the circuit according to the invention shown in FIG. 2A.

FIGS. 2A and 2B are respectively a schematic sectional view and an equivalent circuit diagram thereof showing a semiconductor input protective device of an embodiment according to the present invention.

As shown in the drawings, there are formed on a surface portion of a P-type silicon substrate 1 a lateral NPN bipolar transistor Q and an N-channel Metal-Insulator-Semiconductor (MIS) transistor including, for example, a MOS transistor M3 having as an insulating gate oxide film, a field oxide film 4 of 0.6 μm thick.

Specifically, the lateral NPN bipolar transistor Q has an emitter (an N-type diffusion layer 3-4) and a base (the P-type silicon substrate 1) both connected to the ground line 6, and a collector (an N-type diffusion layer 3-3) connected to the signal line 8. Next, the N-channel MOS transistor M3 has a source (an N-type diffusion layer 3-1) and a gate electrode 5 both connected to the power source line 7, and a drain (an N-type diffusion layer 3-2) connected to the signal line 8.

In FIGS. 2A and 2B, a pad 9 is a bonding terminal formed on the semiconductor chip and is connected to a signal terminal (not shown in the drawings) of the IC package. A similar pad Is provided correspondingly to the ground terminal GND and the power source terminal $V_{CC}$ in the semiconductor chip. The ground line 6, the power source line 7 and the signal line 8, etc. are, for example, aluminum interconnecting layers fabricated in the semiconductor chip. The gate electrode 5 of the N-channel MOS transistor M3 is made of the same material as that of the MOS transistor constituting an internal circuit (not shown). Furthermore, the N-type diffusion layers 3-1 to 3-4 are formed simultaneously with the source/drain regions of the N-channel MOS transistors of the internal circuit.

Hereunder, how the surge voltage externally applied to the semiconductor device is released will be explained.

When a surge voltage positive with respect to the ground line 6 is applied to the signal line 8 through the pad 9, the lateral NPN bipolar transistor Q operates, thereby releasing the surge voltage to the ground line 6. On the other hand, when a negative surge voltage is appalled to the signal line 8, the PN-diode formed by the collector 3-3 and the base (the P-type silicon substrate 1) of this transistor Q is forwardly biased thereby releasing the surge voltage to the ground line 6.

Similarly, when a surge voltage positive with respect to the power source line 7 is applied to the signal line 8, this surge voltage can be released to the power source line 7 due to the punch-through of the N-channel MOS transistor M3 and, when a negative surge voltage is applied to the signal line 8, the N-channel MOS transistor M3 becomes conductive and the surge voltage can be released to the power source line 7 through the MOS transistor M3

In this embodiment, the gate electrode 5 of the N-channel MOS transistor M3 is connected to the power source line 7 but, this may instead be connected to the signal line 8 as shown by a dotted line in FIGS. 2A and 2B.

Figure 3:
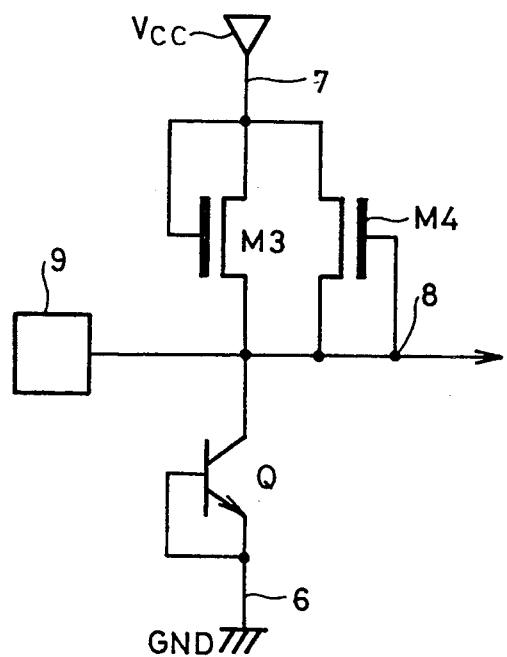
FIG. 3 is an equivalent circuit diagram of a modification of the device shown in FIG. 2A.
Figure 1A:
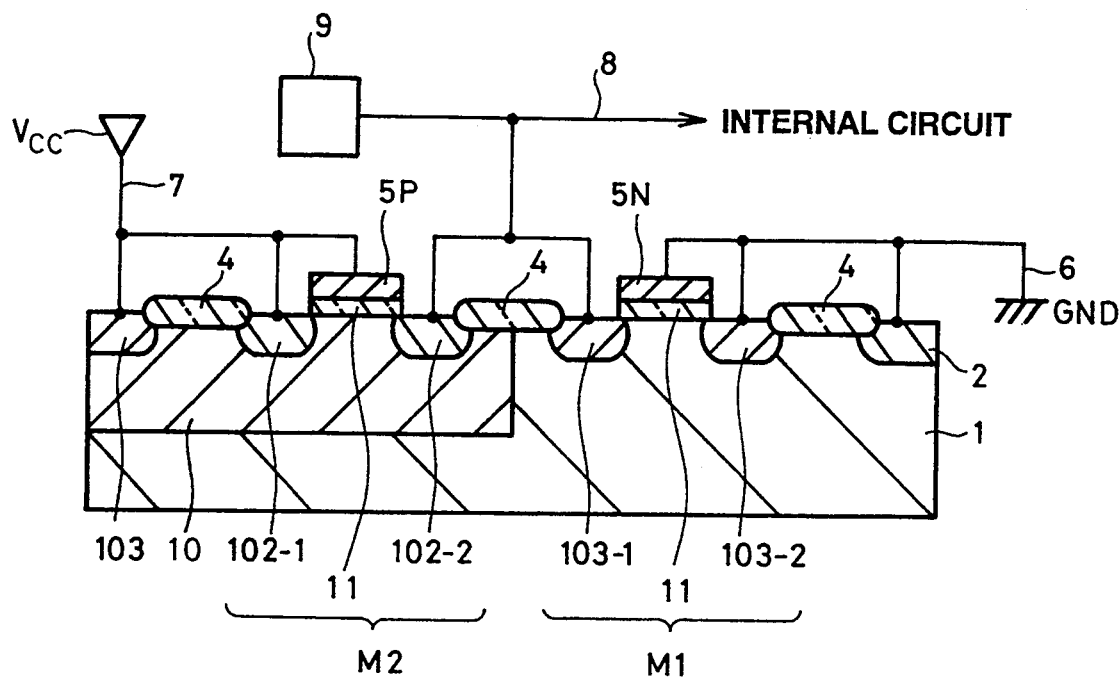
FIG. 1A is a schematic sectional view showing a conventional semiconductor input protective device of the type to which the present invention relates.
Figure 1B:
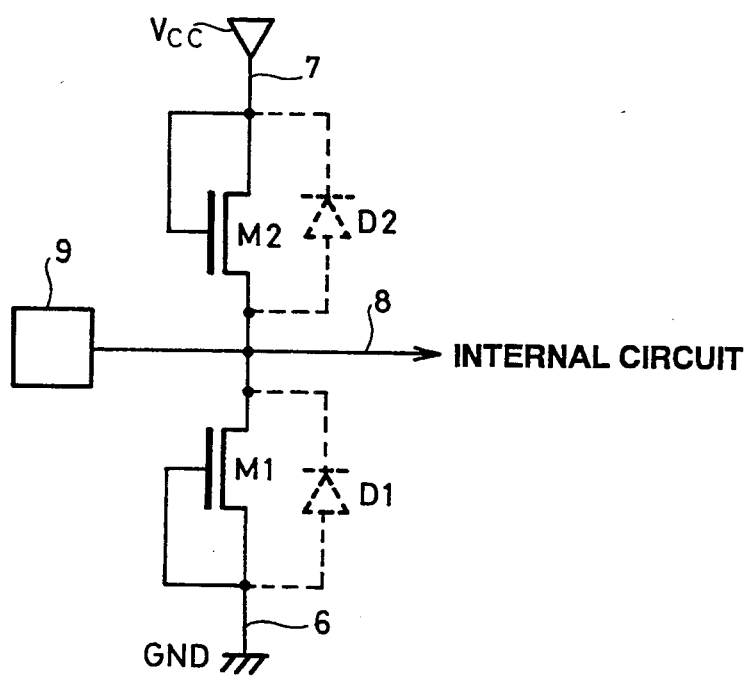
FIG. 1B is an equivalent circuit diagram of the conventional circuit shown in FIG. 1A.

Furthermore, if two N-channel MOS transistors M3 and M4 are connected in parallel between the power source line 7 and the signal line 8 as shown in FIG. 3, with one of the gate electrodes being connected to the power source line 7 and the other being connected to the signal line 8, it is possible to further enhance tile effect of the input protection performance.

As has been described hereinabove, according to the invention, since the semiconductor input protective device has as input protective elements a lateral NPN bipolar transistor and an N-channel MOS transistor having a thick gate insulating film, it is possible to prevent the protective MOS transistors from becoming inoperable even where a high voltage interface is effected through the semiconductor input protective device, thereby enhancing the reliability of the overall semiconductor device.

While the invention has been described in its preferred embodiment, it is to be understood that the words which have been used are words of description rather than limitation and that changes within the purview of the appended claims may be made without departing from the true scope and spirit of the invention in its broader aspects.

What is claimed is:

1. A semiconductor input protective device formed between a power source line and a ground line and connected to an internal circuit, said device comprising:
    an NPN type bipolar transistor having a collector connected to a signal line extending to a pad, and an emitter and a base commonly connected to a ground line;
    a first N-channel MIS transistor in which one of a drain and a source thereof is connected to said signal line and the other one of the drain and the source is connected to said power source line, said first N-channel MIS transistor having a threshold voltage higher than a power source voltage supplied to said power source line and having a gate insulation film thicker than a gate insulation film of a MIS transistor constituting said internal circuit; and
    a second N-channel MIS transistor connected in parallel with said first N-channel MIS transistor, with a gate of one of said first and second N-channel MIS transistors being connected to the signal line and a gate of the other one of said first and second N-channel MIS transistors being connected to the power source line.

2. A semiconductor input protective device according to claim 1, in which said gate insulation film of each of said N-channel MIS transistors is a film formed simultaneously with a field oxide film.

3. A semiconductor input protective device which is formed between a power source line and a ground line and connected to an internal circuit, said semiconductor input protective device comprising:
    an NPN type bipolar transistor having a collector connected to a signal line extending to a pad, and an emitter and a base commonly connected to a ground line;
    a first N-channel MIS transistor having a source connected to said signal line, and a drain and a gate commonly connected to said power source line; and
    a second N-channel MIS transistor connected in parallel with said first N-channel MIS transistor and having a drain connected to said power source line, and a source and a gate commonly connected to said signal line,
    each of said first and second N-channel MIS transistors having a threshold voltage higher than a power source voltage supplied to said power source line and having a gate insulation film thicker than a gate insulation film of a MIS transistor constituting said internal circuit.

* * * * *

UNITED STATES PATENT AND TRADEMARK OFFICE
CERTIFICATE OF CORRECTION

PATENT NO. : 5,349,227
DATED : September 20, 1994
INVENTOR(S) : MURAYAMA

It is certified that error appears in the above-identified patent and that said Letters Patent is hereby corrected as shown below:

ABSTRACT, line 2, delete "blpolar" and insert --bipolar--.

Col. 3, line 17, delete "Is" and insert --is--.

Col. 3, line 37, delete "appalled" and insert --applied--.

Signed and Sealed this

Twenty-first Day of February, 1995

Attest:

BRUCE LEHMAN

Attesting Officer

Commissioner of Patents and Trademarks